(12) United States Patent
Schoenfeld

(10) Patent No.: US 7,460,429 B2
(45) Date of Patent: *Dec. 2, 2008

(54) CIRCUIT AND METHOD FOR REDUCING POWER IN A MEMORY DEVICE DURING STANDBY MODES

(75) Inventor: Aaron M. Schoenfeld, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/778,366

(22) Filed: Jul. 16, 2007

(65) Prior Publication Data

US 2007/0263471 A1 Nov. 15, 2007

Related U.S. Application Data

(63) Continuation of application No. 11/057,745, filed on Feb. 14, 2005, now Pat. No. 7,248,532, which is a continuation of application No. 10/713,520, filed on Nov. 14, 2003, now Pat. No. 6,903,994.

(51) Int. Cl.
   *G11C 5/14* (2006.01)

(52) U.S. Cl. .................. 365/227; 365/229; 365/222

(58) Field of Classification Search .............. 365/227, 365/229, 222
   See application file for complete search history.

(56) References Cited

U.S. PATENT DOCUMENTS

| | | | |
|---|---|---|---|
| 4,943,960 A | 7/1990 | Komatsu et al. | |
| 5,278,796 A | 1/1994 | Tillinghast et al. | |
| 5,345,119 A | 9/1994 | Khoury | |
| 5,544,120 A | 8/1996 | Kuwagata et al. | |
| 5,629,897 A | 5/1997 | Iwamoto et al. | |
| 5,677,890 A | 10/1997 | Liong et al. | |
| 5,708,611 A | 1/1998 | Iwamoto et al. | |
| 5,717,644 A | 2/1998 | Hadderman et al. | |
| 6,118,719 A | 9/2000 | Dell et al. | |
| 6,147,921 A | 11/2000 | Novak et al. | |
| 6,208,124 B1 | 3/2001 | Fuchigami et al. | |
| 6,346,839 B1 | 2/2002 | Mnich | |
| 6,377,502 B1 | 4/2002 | Honda et al. | |
| 6,510,088 B2 | 1/2003 | Chen et al. | |
| 6,529,411 B2 | 3/2003 | Tonda et al. | |
| 6,563,746 B2 | 5/2003 | Fujioka et al. | |
| 6,603,696 B2 | 8/2003 | Janzen | |
| 6,754,784 B1 * | 6/2004 | North et al. ............. 711/145 |
| 6,903,994 B1 | 6/2005 | Schoenfeld | |
| 7,050,049 B2 * | 5/2006 | Byun ....................... 345/211 |
| 2003/0112691 A1 * | 6/2003 | Sundaram et al. ......... 365/226 |

* cited by examiner

*Primary Examiner*—Huan Hoang
(74) *Attorney, Agent, or Firm*—TraskBritt

(57) ABSTRACT

A memory device responsive to standby mode commands for reducing internal operational power on a memory device is disclosed. The memory device includes a circuit for reducing power during a standby mode with the circuit including a reference with at least first and second reference signals. The circuit also includes a switching device for switching between the first and second reference signals in response to the standby mode command and further controls an internal operational power regulator to adjust between normal and low-power outputs further reducing the power to portions of the memory device.

14 Claims, 5 Drawing Sheets

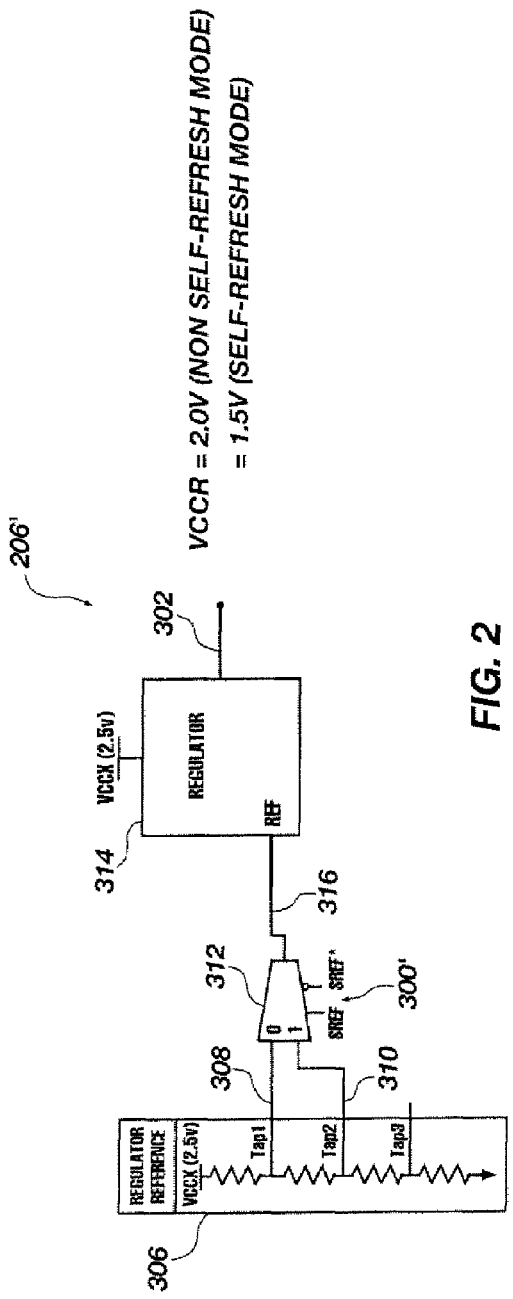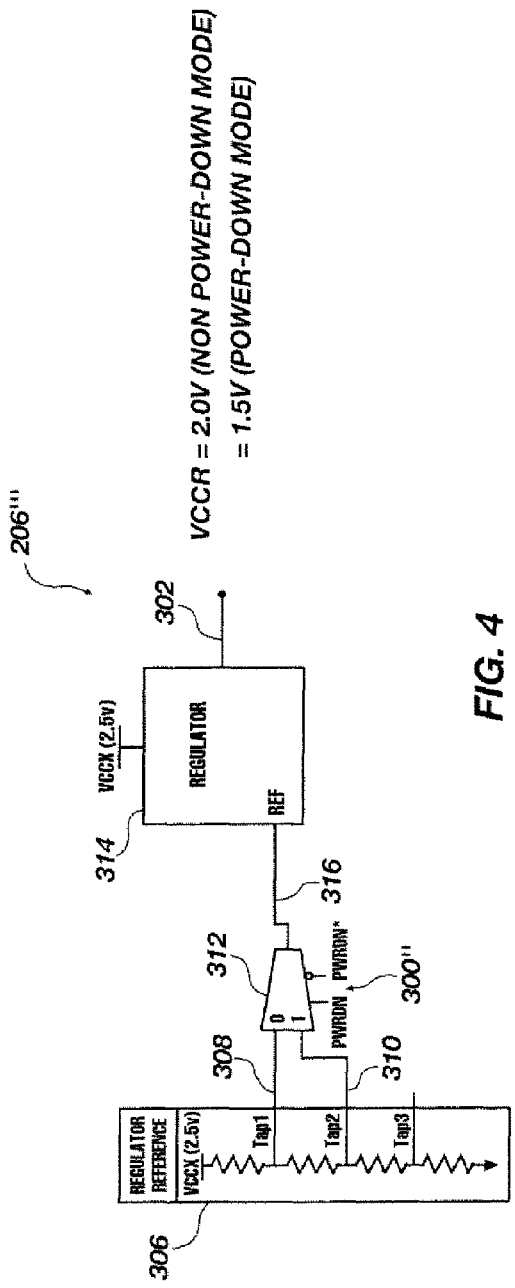

CIRCUIT AND METHOD FOR REDUCING POWER IN A MEMORY DEVICE DURING STANDBY MODES

CROSS-REFERENCE TO RELATED APPLICATIONS

This application is a continuation of application Ser. No. 11/057,745, filed Feb. 14, 2005, now U.S. Pat. No. 7,248,532, issued Jul. 24, 2007, which is a continuation of application Ser. No. 10/713,520, filed Nov. 14, 2003, now U.S. Pat. No. 6,903,994, issued Jun. 7, 2005. The disclosure of each of the previously referenced U.S. patent applications and patents is hereby incorporated by reference in its entirety.

BACKGROUND OF THE INVENTION

1. Field of the Invention

The present invention relates generally to integrated circuits and, more specifically, to reducing power usage in dynamic random access memory devices during standby periods.

2. State of the Art

Portable electronic devices require data storage, such as a memory device, for providing large storage capacity and low power consumption. To reduce power consumption and extend available power supplies, such as batteries, the memory device typically operates in a low-power mode when stored data is not being accessed. In the low-power mode, supply voltages within the memory device are typically reduced to lower the power consumption of the components. While the supply voltages are varied to reduce power consumption in the low-power mode, data stored within the memory devices must be retained.

In typical electronic devices, large storage capacities are generally desirable. Accordingly, a dynamic random access memory (DRAM), which has a relatively large storage capacity over other types of memories, is frequently utilized. In a DRAM, the data is "dynamic" because the data stored within the memory cells of the memory device must be periodically recharged or "refreshed" to maintain an adequate charge to signify a specific data bit state. By way of example, a conventional DRAM device includes a plurality of memory cells arranged in rows and columns with each memory cell further including an access transistor and a storage capacitor connected in series between a digital line and a reference voltage generally equivalent to VCC/2.

The data stored in the memory cell in the form of voltage across the capacitor must be periodically refreshed. Generally, once the data is stored in the form of a voltage across the capacitor and the access transistor is deactivated, leakage currents result in this stored voltage which change over time and, if not refreshed, may result in a different binary state of data being stored in the memory cell. Those of ordinary skill in the art appreciate that in a conventional DRAM memory cell, the storage capacitor is recharged each time the memory cell is read as the reading operation refreshes or recharges the memory cell to an adequate voltage level to retain the corresponding logic information stored therein.

It should be appreciated that since the charge stored within the storage capacitor depletes, the refreshing operation must be performed at a specified rate in order to retain the logic stored within the memory cells. The rate at which the data stored in the memory cells must be periodically refreshed is known as the "refresh rate" of the memory cells and is a function of a number of different parameters including the operating temperature of the DRAM, the number of rows of memory cells in the array and the value of the supply voltage VCC applied to the DRAM, to name a few. As the supply voltage VCC decreases, the refresh rate increases due, for example, to a reduced voltage being stored across the storage capacitors and the need to refresh this voltage more frequently to ensure the stored voltage does not decay to an insufficient level due to the leakage currents. The refresh rate also must increase as the supply voltage VCC decreases to minimize the possibility of restoring incorrect data into the memory cell.

Where the memory cell is contained in a DRAM, a memory controller typically reads data from the desired memory cells in response to requests from a microprocessor or other control unit causing each accessed memory cell to be automatically refreshed as described. However, the data stored in all the memory cells must be periodically refreshed and, as a result, a periodic refresh command to the DRAM containing the memory cells must be issued thereby causing the control circuitry to access each memory cell. Even when the memory controller is not accessing the DRAM, the memory cells must still be periodically refreshed. To refresh the memory cells under such conditions, the memory controller issues a self-refresh command to the DRAM placing the DRAM in a self-refresh mode of operation during which circuitry internal to the DRAM periodically refreshes the memory cells.

The issuance of a self-refresh command to a DRAM by a microprocessor, for example, signifies that the microprocessor or other controlling circuitry is preoccupied with other functionality and is not in need of imminent data from the DRAM.

While some progress has been made at reducing power consumed by a DRAM when in various standby-like modes, additional improvements are highly desirable. Therefore, there is a need for an improved approach for further minimizing the power consumed by a DRAM.

BRIEF SUMMARY OF THE INVENTION

The present invention is directed, in exemplary embodiments, to a device and system for reducing power in a DRAM during standby modes. In one embodiment, a circuit for reducing power during a standby mode of a memory device is provided. The device includes a reference including at least first and second reference signals, a switching device and a first regulator. The switching device includes at least first and second switching inputs respectively coupled to the at least first and second reference signals and a switching output configured to toggle from outputting the first reference signal to outputting the second reference signal during a standby mode. The first regulator is coupled and responsive to the switching output of the switching device and the first regulator is configured to output a first internal operational power derived from an external operational power as regulated by one of the first and second reference signals.

In another exemplary embodiment of the present invention, a memory device is provided. The memory device comprises a memory array including at least one memory cell configured to be periodically refreshed, control logic coupled to the memory array and responsive to mode commands from a memory controller and a circuit for reducing power during a standby mode of the mode commands. The circuit includes a reference having at least first and second reference signals, a switching device and a first regulator. The switching device includes at least first and second switching inputs respectively coupled to the at least first and second reference signals and a switching output configured to toggle between outputting the first reference signal to outputting the second reference signal during a standby mode. The first regulator is coupled and responsive to the switching output of the switching device and the first regulator is configured to output a first internal operational power derived from an external operational power as regulated by one of the first and second reference signals.

In yet another embodiment, an electronic system including an input device, an output device, a memory device, and a processor device coupled to the input, output, and memory device is provided. The memory device includes a memory array having at least one memory cell configured to be periodically refreshed, control logic coupled to the memory array and responsive to mode commands from a memory controller and a circuit for reducing power during a standby mode of the mode commands. The control logic includes a reference including at least first and second reference signals, a switching device and a first regulator. The switching device includes at least first and second switching inputs respectively coupled to the at least first and second reference signals and a switching output configured to toggle between outputting the first reference signal to outputting the second reference signal during a standby mode. The first regulator is coupled and responsive to the switching output of the switching device, and is configured to output a first internal operational power derived from an external operational power as regulated by one of the first and second reference signals.

In yet a further embodiment of the present invention, an integrated circuit die is provided. The die includes a memory array having at least one memory cell configured to be periodically refreshed and control logic coupled to the memory array and responsive to mode commands from a memory controller. The die further includes a circuit for reducing power during a standby mode of the mode commands. The circuit includes a reference with at least first and second reference signals and a switching device including at least first and second switching inputs respectively coupled to the at least first and second reference signals and a switching output configured to toggle between outputting the first reference signal to outputting the second reference signal during a standby mode. The circuit further includes a first regulator coupled and responsive to the switching output of the switching device, the first regulator being configured to output a first internal operational power derived from an external operational power as regulated by one of the first and second reference signals.

In another embodiment of the present invention, a semiconductor wafer is provided. The wafer includes an integrated circuit with a memory array including at least one memory cell configured to be periodically refreshed, control logic coupled to the memory array and responsive to mode commands from a memory controller and a circuit for reducing power during a standby mode of the mode commands. The circuit includes a reference, switching device and a first regulator.

In yet a further embodiment of the present invention, a method for reducing power during a standby mode of a memory device is provided. The method includes switching from a higher reference signal to a lower reference signal as an output reference signal during a standby mode of a memory device and regulating a first lower internal operational power from an external operational power in response to the output reference signal during the standby mode. The first lower internal operational power is configured to operate at least a first portion of the memory device during a duration of the standby mode.

BRIEF DESCRIPTION OF THE SEVERAL VIEWS OF THE DRAWINGS

In the drawings, which illustrate what is currently considered to be the best mode for carrying out the invention:

FIG. 2 is a circuit diagram of power reduction circuitry to generate a regulated power responsive to a self-refresh mode of a memory system, in accordance with an embodiment of the present invention;

FIG. 4 is a circuit diagram of power reduction circuitry to generate a regulated power responsive to a power-down mode of a memory system, in accordance with a further embodiment of the present invention;

DETAILED DESCRIPTION OF THE INVENTION

In an attempt to further reduce power consumption by a DRAM, internal circuitry is responsive to standby-like commands such as self-refresh and power-down commands and lowers or suspends operation of power consuming portions of the DRAM. For example, if the microprocessor or other controlling circuitry is not in need of imminent data from the DRAM, then functionality such as input/output buffers are temporarily unnecessary and the power supply thereto may be reduced or entirely removed for the duration of the self-refresh mode. Other memory device components may be reduced in power by lowering their operational voltages while remaining within their operational specifications.

Figure 1:
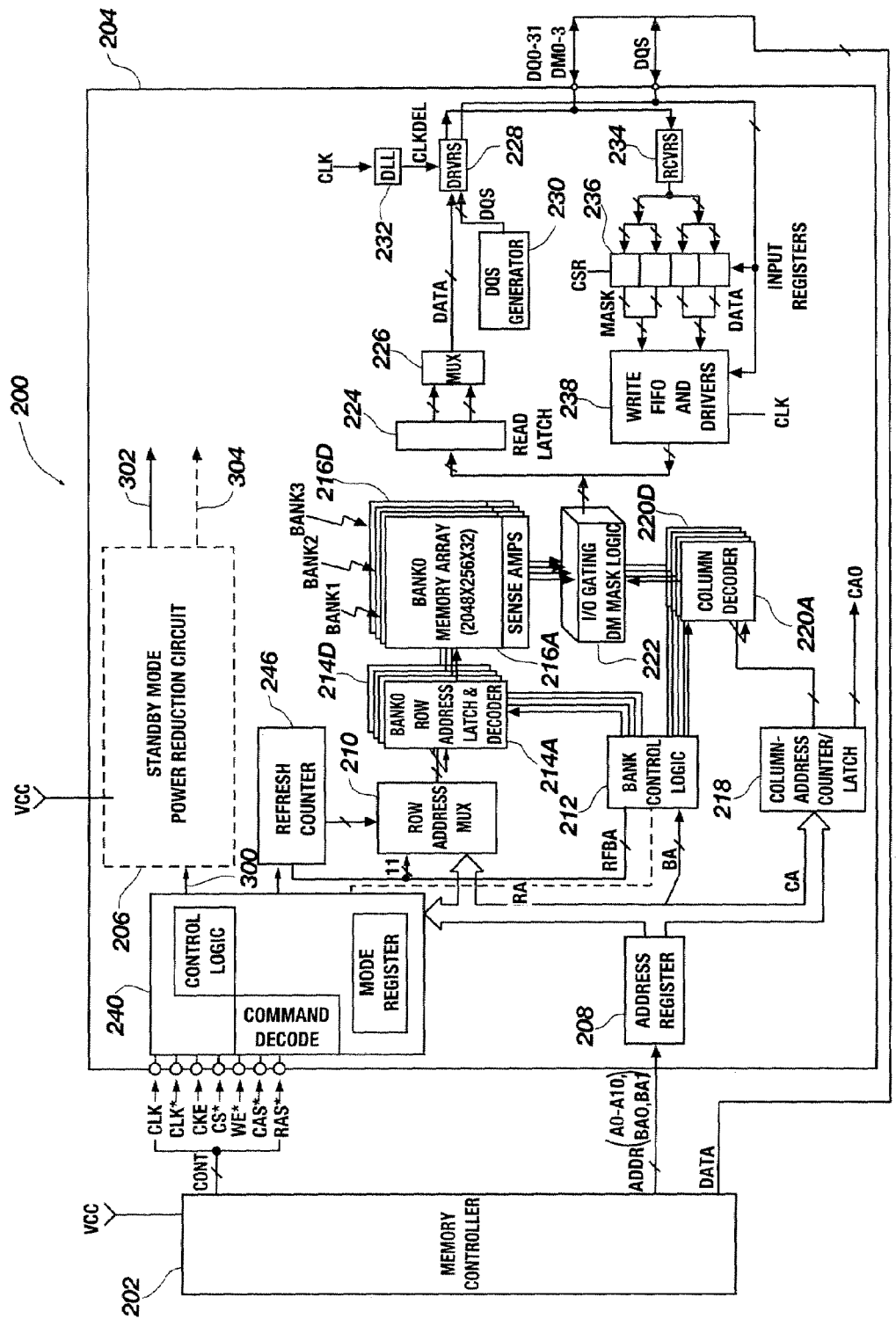
FIG. 1 is a functional block diagram of a memory system including a memory controller and a memory device which further includes standby mode power reduction circuitry, according to an embodiment of the present invention.

FIG. 1 is a functional block diagram of a memory system 200 including a memory controller 202 coupled to a memory device 204 that includes a standby mode power reduction circuit 206 for reducing power consumption on a memory device during a standby-like mode, in accordance with various embodiments of the present invention. In operation, the power reduction circuit 206 further regulates at least portions of the internal voltages down to lower levels during specific standby-like modes, an example of which are self-refresh and power-down modes. The memory device 204 in FIG. 1 is a double-data rate (DDR) synchronous dynamic random access memory ("SDRAM"), although the principles described herein are applicable to any memory device containing memory cells that must be refreshed (i.e., that store dynamic data), such as conventional DRAMs and SDRAMs, as well as packetized memory device like synchronous link DRAM ("SLDRAM") and Rambus DRAM ("RDRAM"), and are equally applicable to any integrated circuit that stores dynamic data. In the following description, certain details are set forth to provide a sufficient understanding of the invention. It will be clear to one of ordinary skill in the art, however, that the invention may be practiced without these particular details. In other instances, well-known circuits, control signals, timing protocols, and software operations have not been shown in detail or omitted entirely in order to avoid unnecessarily obscuring the invention.

Before describing the power reduction circuit 206 in more detail, the various components of the memory device 204 will first be described. The memory controller 202 applies row, column, and bank addresses to an address register 208 over an address bus ADDR. Typically, a row address RA and a bank address BA are initially received by the address register 208 and applied to a row address multiplexer 210 and bank control logic circuit 212, respectively. The row address multiplexer 210 applies either the row address RA received from the address register 208 or a refresh row address RFRA received from the self-refresh counter 246 to a plurality of row address latch and decoder circuits 214A-214D. The bank control logic circuit 212 activates the plurality of row address latch and decoder circuit 214A-214D corresponding to either the received bank address BA or a refresh bank address RFBA from the self-refresh counter 246, and the activated row address latch and decoder circuit latches and decodes the received row address. In response to the decoded row address, the activated plurality of row address latch and decoder circuits 214A-214D applies various signals to a corresponding memory banks or arrays 216A-216D to activate a row of memory cells corresponding to the decoded row address. The data in the memory cells in the accessed row is stored in sense amplifiers coupled to the array 216A-216D, which also refreshes the accessed memory cells as previously described. The row address multiplexer 210 applies the refresh row address RFRA to the plurality of row address latch and decoder circuits 214A-214D and the bank control logic circuit 212 uses the refresh bank address RFBA when the memory device 204 operates in an auto-refresh or self-refresh mode of operation in response to the memory controller 202 applying an auto- or self-refresh command to he memory device 204.

After the address register 208 via memory controller 202 has applied the row and bank addresses RA, BA, the memory controller applies a column address CA on the address bus ADDR. The address register 208 provides the column address CA to a column address counter and latch circuit 218 which, in turn, latches the column address and applies the latched column address to a plurality of column decoders 220A-220D. The bank control logic circuit 212 activates the column decoders 220A-220D corresponding to the received bank address BA, and the activated plurality of column decoders 220A-220D decodes the column address CA from the counter and latch circuit 218. Depending on the operating mode of the memory device 204, the counter and latch circuit 218 either directly applies the latched column address to the column decoders 220A-220D, or applies a sequence of column addresses to the decoders starting at the column address CA provided by the address register 208. In response to the column address from the counter and latch circuit 218, the activated plurality of column decoders 220A-220D applies decode and control signals to an I/O gating and data masking circuit 222 which, in turn, accesses memory cells corresponding to the decoded column address in the activated row of memory cells in the array 216A-216D being accessed.

During data read operations, data being read from the activated array 216A-216D is coupled through the I/O gating and data masking circuit 222 to a read latch 224. The I/O gating and data masking circuit 222 supplies N bits of data to the read latch 224, which then applies two N/2 bit words to a multiplexer 226. In a specific embodiment, the I/O gating and data masking circuit 222 may provide 64 bits to the read latch 224 which, in turn, provides two 32 bits words to the multiplexer 226. A data driver circuit 228 sequentially receives the N/2 bit words from the multiplexer 226 and also receives a data strobe signal DQS from a strobe signal generator 230 and a delayed clock signal CLKDEL from a delay-locked loop (DLL) circuit 232. The DQS signal has the same frequency as the CLK, CLK* signals, and is used by the memory controller 202 in latching data from the memory device 204 during read operations. In response to the delayed clock signal CLKDEL, the data driver circuit 228 sequentially outputs the received N/2 bit words as corresponding data words DQ that are in synchronism with rising and falling edges of the CLK signal, respectively, and also outputs the data strobe signal DQS having rising and falling edges in synchronism with rising and falling edges of the CLK signal, respectively. Each data word DQ and the data strobe signal DQS collectively define a data bus DATA coupled to the memory controller 202 which, during read operations, latches each N/2 bit DQ word on the DATA bus responsive to the data strobe signal DQS. As will be appreciated by those of ordinary skill in the art, the CLKDEL signal is a delayed version of the CLK signal, and the DLL circuit 232 adjusts the delay of the CLKDEL signal relative to the CLK signal to ensure that the DQS signal and the DQ words are placed on the DATA bus in synchronism with the CLK signal. The DATA bus also includes masking signals DQM0-X, which will be described in more detail below with reference to data write operations.

During data write operations, the memory controller 202 applies N/2 bit data words DQ, the data strobe signal DQS, and corresponding data masking signals DM0-X on the data bus DATA. A data receiver circuit 234 receives each DQ word and the associated DM0-X signals, and applies these to an input register 236 that is clocked by the DQS signal. In response to a rising edge of the DQS signal, the input register 236 latches a first N/2 bit DQ word and the associated DM0-X signals, and in response to a falling edge of the DQS signal the input register 236 latches the corresponding N/2 bit DQ word and associated DM0-X signals. The input register 236 provides the two latched N/2 bit DQ words as an N-bit word to a write FIFO and driver circuit 238, which clocks the applied DQ word and DM0-X signals into the write FIFO and driver circuit 238 in response to the DQS signal. The DQ word is clocked out of the write FIFO and driver circuit 238 in response to the CLK signal, and is applied to the I/O gating and data masking circuit 222. The I/O gating and data masking circuit 222 transfers the DQ word to the accessed memory cells in the activated arrays 216A-216D subject to the DM0-X signals, which may be used to selectively mask bits or groups of bits in the DQ words (i.e., in the write data) being written to the accessed memory cells.

A control logic and command decoder circuit 240 receives a plurality of command and clocking signals from the memory controller 202 over a control bus CONT, and generates a plurality of control and timing signals to control the components 206-238 during operation of the memory device 204. The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The memory controller 202 drives the command signals CS*, WE*, CAS*, and RAS* to values corresponding to a particular command, such as a read, write, auto-refresh, and standby-like commands such as self-refresh and power-down commands. In response to the clock signals CLK, CLK*, the command decoder circuit 240 latches and decodes an applied command, and generates a sequence of control signals, including power reduction control signal 300, that control various components in the memory device 204 to execute the function of the applied command. The clock enable signal CKE enables clocking of the command decoder circuit 240 by the clock signals CLK, CLK*. The command decoder circuit 240 latches command and address signals at positive edges of the CLK, CLK* signals (i.e., the crossing point of CLK going high and CLK* going low), while the input registers 236 and data driver circuits 228 transfer data into and from, respectively, the memory device 204 in response to both edges of the data strobe signal DQS and thus at double the frequency of the strobe signal and clock signals CLK, CLK*. For this reason the memory device 204 is referred to as a double-data-rate device, with data being transferred to and from the device at double the rate of a conventional SDRAM, which transfers data at a rate corresponding to the frequency of the applied clock signal. The detailed operation of the control logic of the command decoder circuit 240 in generating the control and timing signals is conventional, and thus, for the sake of brevity, will not be described in more detail.

As previously mentioned, in battery-powered electronic devices it is desirable to place the memory device 204 in a standby or low-power mode of operation when the memory controller 202 is not accessing data stored in the memory device 204. In the memory device 204, exemplary low-power or standby modes include self-refresh and power-down modes. To place the memory device 204 in a self-refresh mode of operation, the memory controller 202 applies a self-refresh command to the memory device 204. In response to the self-refresh command, the command decoder circuit 240 applies control signals to the row address multiplexer 210 and the bank control logic circuit 212 that cause the circuits to utilize the refresh row address RFRA and refresh bank address RFBA from the self-refresh counter 246 to sequentially access each row of memory cells in the memory banks or arrays 216A-216D to thereby refresh the memory cells. The self-refresh counter 246 controls the refresh rate of the memory cells in the arrays 216A-216D. The command decoder circuit 240 applies power reduction control signals 300 to power reduction circuit 206 which further reduces power levels within active portions of the memory device 204 by regulating an internal operational power VCCR 302 to portions of the circuitry to a lower voltage level. In other embodiments, other operational powers, an example of which is illustrated as VCCDLL 304, may also be separately regulated to lower operational power levels to isolated components, such as DLL circuit 232, during standby-like modes. The operation of the power reduction circuit 206 during the standby-like modes along with the structure of the power reduction circuit 206 will now be described in more detail.

FIGS. 2-5 identify specific exemplary embodiments of the power reduction circuit 206. Generally, the power reduction circuit utilizes a first reference signal of a higher voltage level for regulating operational power VCCR at a higher voltage level during fully operational (i.e., nonstandby-like) modes and when so commanded utilizes a second reference signal of a lower voltage level for regulating the operational voltage VCCR to a lower voltage level during standby-like modes. Those of ordinary skill in the art appreciate that standby-like modes significantly reduce the power utilized on the memory device by turning off functional portions of the memory device that are not utilized during a standby-like mode. For example, in a standby-like mode, memory data is not read or written from or to the memory device by the memory controller and therefore power-consuming input and output buffers of a memory device are unnecessary and may therefore be inactivated or entirely powered off. Various embodiments of the present invention further regulate the operational voltages of active components to lower-power levels within their operational specifications during standby modes.

FIG. 2 specifically illustrates a power reduction circuit 206' configured to regulate an operational power VCCR between fully operational levels during nonstandby modes and lower standby operational power levels during one or more standby-like modes, in accordance with an embodiment of the present invention. The power reduction circuit 206' includes a regulator reference 306 arranged for generating at least a first reference signal 308 of a higher power level and a second reference signal 310 of a lower power level. By way of example and not limitation, FIGS. 2-5 illustrate the regulator reference 306 as a voltage divider network comprised of resistive elements with multiple taps or access points each exhibiting varying signal levels. Other differing implementations of references having differing reference power levels are also contemplated within the scope of the present invention and a voltage divider network is not to be considered as limiting. Because of technological advancements toward smaller signal levels and faster signals, it is desirable for regulator reference signals to be stable with minimal noise that may cause contamination of the data within the memory array.

The power reduction circuit 206' further includes a switching or routing device for selecting between the first reference signal 308 and the second reference signal 310. By way of example and not limitation, a switching device is illustrated as a multiplexer 312 having inputs for coupling with at least the first and second reference signals 308, 310, an output for multiplexing one of the inputs therethrough and one or more control inputs for coupling with the power reduction control signals 300 (FIG. 1). In the present embodiment, the power reduction control signals are illustrated as control signals 300' and are specific to a self-refresh low-power mode causing the selection of a reference signal that causes the operational power level to be reduced during the self-refresh mode. The power reduction circuit 206' further comprises a means for regulating an external power signal to an operational power level consistent with the memory device operational power levels in response to a reference signal 316. In the present embodiment and by way of example and not limitation, the means for regulating the memory device operational voltage is illustrated as a regulator 314 which includes a reference input for coupling with the reference signal 316 at the output of multiplexer 312. The regulator 314 further includes a regulated output which generates internal operational power VCCR 302. The regulator 314 generates an output from the external operational power VCCX that is proportional to the level of the reference signal 316.

FIG. 2 further illustrates one set of typical voltage levels generated from the illustrated embodiment. As shown, the regulator reference 306 receives an external operational voltage VCCX at a voltage level of 2.5 volts and generates first and second reference signals 308, 310 therefrom. During a nonself-refresh mode of operation, the first reference signal 308 couples to the regulator 314 which regulates an internal operational power VCCR 302 to a level of 2.0 volts. When a self-refresh command is received at the memory device 204 (FIG. 1), the second reference signal 310 couples to the reference input of the regulator 314 and regulates the external operational power VCCX from a level of 2.5 volts down to a level of 1.5 volts. Therefore, when a standby-like command, such as a self-refresh command, is received, the memory device 204 (FIG. 1) may isolate and power off certain unnecessary functionality of the memory device 204 with the power reduction circuit 206' further reducing the power consumed by the memory device 204 by lowering the internal operational power from, for example, 2.0 volts to 1.5 volts which is within the operational ranges of the remaining functional components of the memory device 204.

Figure 3:
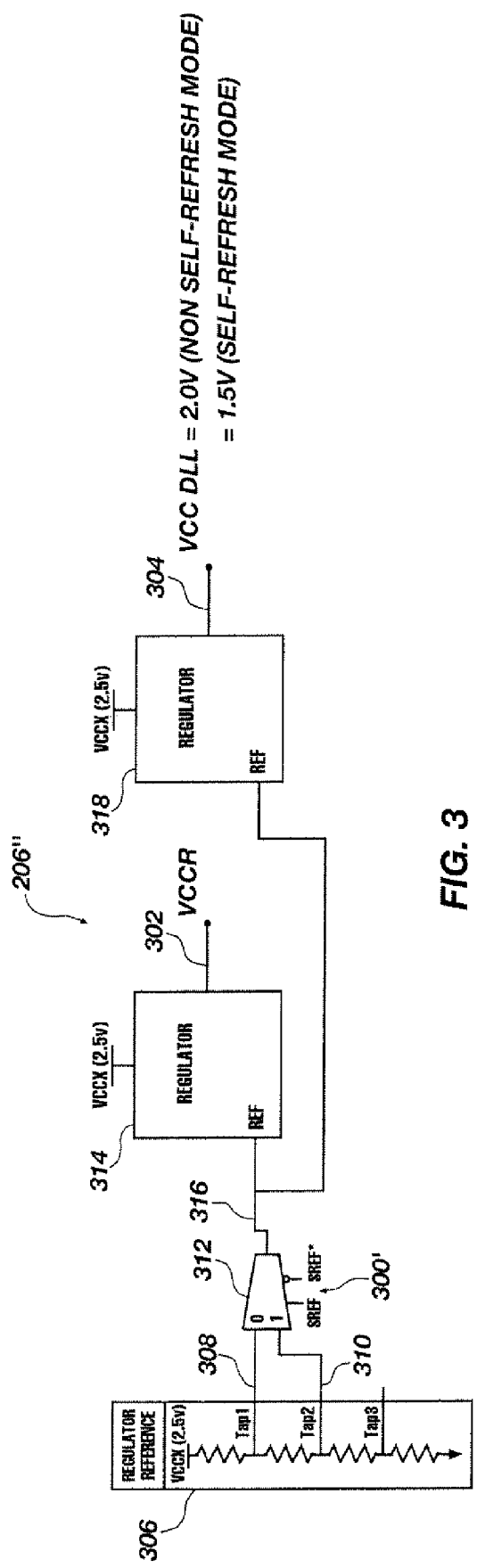
FIG. 3 is a circuit diagram of power reduction circuitry to generate a regulated power and DLL power responsive to a self-refresh mode of a memory system, i accordance with another embodiment of the present invention.

FIG. 3 specifically illustrates a power reduction circuit 206" configured to regulate an internal operational power VCCR 302 according to the embodiment of FIG. 2 and is further configured to regulate another operational power VCCDLL 304, in accordance with another embodiment of the present invention. Some functional portions of the memory device 204 (FIG. 1) benefit from isolated power. By way of example and not limitation, the memory device 204 includes a DLL circuit 232 (FIG. 1) which may generate and is susceptible to switching noise that may feedback onto internal operational power VCCR 302 from circuitry coupled thereto. To mitigate noise on a power signal to noise-sensitive circuitry, the power reduction circuit 206" further includes a means for independently regulating an external power signal to an additional isolated operational power signal consistent with the memory device operational power levels in response to the reference signal 316. In the present embodiment and by way of example and not limitation, the means for regulating the additional operational voltage is illustrated as a regulator 318 which includes a reference input for coupling with the reference signal 316 as received from the multiplexer 312. The regulator 318 further includes a regulated output which generates operational power VCCDLL 304 used for powering the DLL circuit 232 (FIG. 1).

FIG. 3 further illustrates one set of typical voltage levels generated from the illustrated embodiment. As shown, the regulator reference 306 receives an external operational voltage VCCX at a voltage level of 2.5 volts and generates first and second reference signals 308, 310 therefrom. During a nonself-refresh mode of operation, the first reference signal 308 couples to regulators 314, 318 which regulate an internal operational power VCCR 302 to a level of 2.0 volts and an additional operational power VCCDLL 304 to a level of 2.0 volts. When a standby mode command, such as a self-refresh command, is received at the memory device 204 (FIG. 1), the second reference signal 310 couples to the reference input of regulators 314, 318 and regulates the external operational power VCCX having a level of 2.5 volts to form both an internal operational power VCCR 302 having a level of 1.5 volts and an additional operational power VCCDLL 304 having a level of 1.5 volts.

Figure 5:
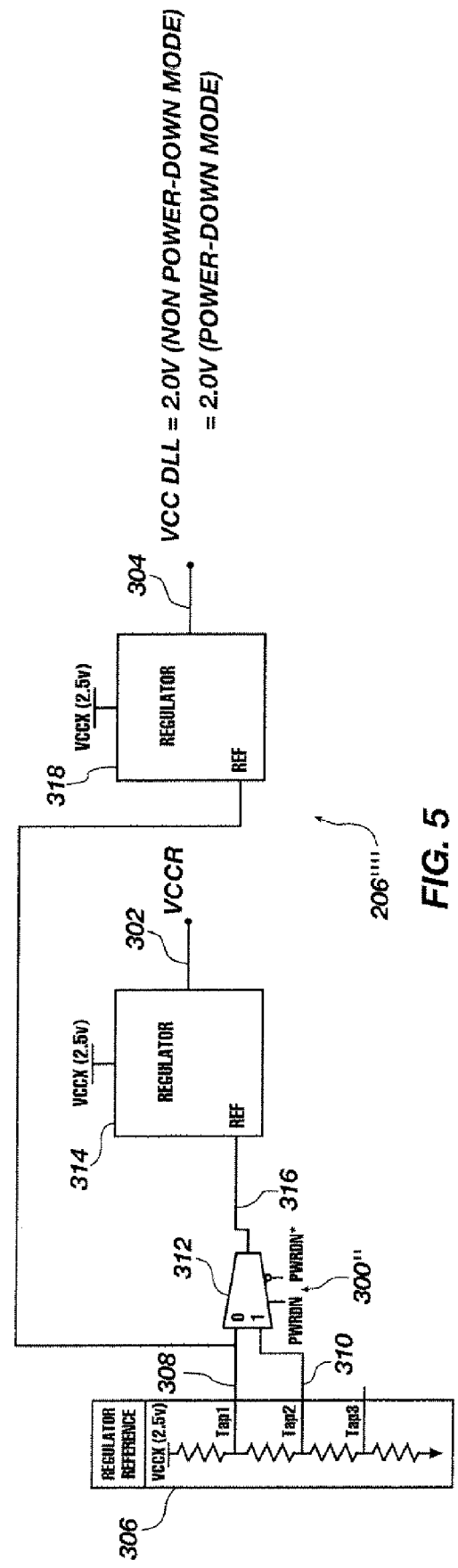
FIG. 5 is a circuit diagram of power reduction circuitry to generate a regulated power and DLL power responsive to a power-down mode of a memory system, in accordance with yet another embodiment of the present Invention.

FIGS. 4 and 5 illustrate other configurations of power reduction circuit 206, in accordance with other embodiments of the present invention. FIG. 4 specifically illustrates a power reduction circuit 206''' configured to regulate an operational power VCCR between fully operational levels during non-power-down modes and lower levels during power-down modes, in accordance with an embodiment of the present invention. The power reduction circuit 206''' includes a regulator reference 306 arranged for generating at least a first reference signal 308 of a higher power level and a second reference signal 310 of a lower power level. The power reduction circuit 206''' further includes a switching or routing device for selecting between the first reference signal 308 and the second reference signal 310. The switching device is illustrated as a multiplexer 312 having inputs for coupling with at least the first and second reference signals 308, 310, an output for multiplexing one of the inputs therethrough and one or more control inputs for coupling with the power reduction control signals 300 (FIG. 1). In the present embodiment, the power reduction control signals are illustrated as control signals 300" and are specific to a power-down low-power mode causing the selection of a reference signal that further causes the operational power level to be reduced during the power-down mode. The power reduction circuit 206''' further comprises a means for regulating an external power signal to an operational power level consistent with the memory device operational power levels in response to a reference signal 316. In the present embodiment, the means for regulating the memory device operational voltages is illustrated as a regulator 314 which includes a reference input for coupling with the reference signal 316 from the output of multiplexer 312 and a regulated output which generates internal operational power VCCR 302.

FIG. 4 further illustrates one set of typical voltage levels generated from the illustrated embodiment. As shown, the regulator reference 306 receives an external operational voltage VCCX and a voltage level of 2.5 volts and generates first and second reference signals 308, 310 therefrom. During a nonpower-down mode of operation, the first reference signal 308 couples to the regulator 314 which regulates an internal operational power VCCR 302 to a level of 2.0 volts. When a power-down refresh command is received at the memory device 204 (FIG. 1), the second reference signal 310 couples to the reference input of the regulator 314 and regulates the external operational power VCCX from a level of 2.5 volts down to a level of 1.5 volts. Therefore, when a standby-like command, such as a power-down command, is received, the memory device 204 (FIG. 1) may isolate and power off certain unnecessary functionality of the memory device 204 with the power reduction circuit 206''' further reducing the power consumed by the memory device 204 by lowering the internal operational power from, for example, 2.0 volts to 1.5 volts which remain within the operational range of the still powered portions of memory device 204.

FIG. 5 specifically illustrates a power reduction circuit 206'''' configured to regulate an internal operational power VCCR 302 according to the embodiment of FIG. 4 and is further configured to regulate another operational power VCCDLL 304, in accordance with another embodiment of the present invention. As stated, some functional portions of the memory device 204 (FIG. 1) benefit from isolated power. When the memory device 204 includes, for example, a DLL circuit 232 (FIG. 1), independent isolation of the power provided to the DLL circuit 232 may be desirable. As illustrated in FIG. 5, the power reduction circuit 206'''' further includes a means for independently regulating an external power signal level to an additional isolated operational power signal. The means for regulating the additional operational voltage is illustrated as a regulator 318 which includes a reference input for coupling with the first reference signal 308 as received from the regulator reference 306. The regulator 318 further includes a regulated output which generates operational power VCCDLL 304 used for powering the DLL circuit 232 (FIG. 1).

FIG. 5 further illustrates one set of typical voltage levels generated from the illustrated embodiment. As shown, the regulator reference 306 receives an external operational voltage VCCX at a voltage level of 2.5 volts and generates first and second reference signals 308, 310 therefrom. During a nonpower-down mode of operation, the first reference signal 308 couples to regulators 314, 318 which regulate an internal operational power VCCR 302 to a level of 2.0 volts and an additional operational power VCCDLL 304 to a level of 2.0 volts. When a power-down command is received at the memory device 204 (FIG. 1), the second reference signal 310 couples to the reference input of regulator 314 and regulates the external operational power VCCX having a level of 2.5 volts to form an internal operational power VCCR 302 having a level of 1.5 volts while retaining operational power VCCDLL 304 having a level of 2.0 volts allowing the DLL circuit 232 to remain in a locked state.

Figure 6:
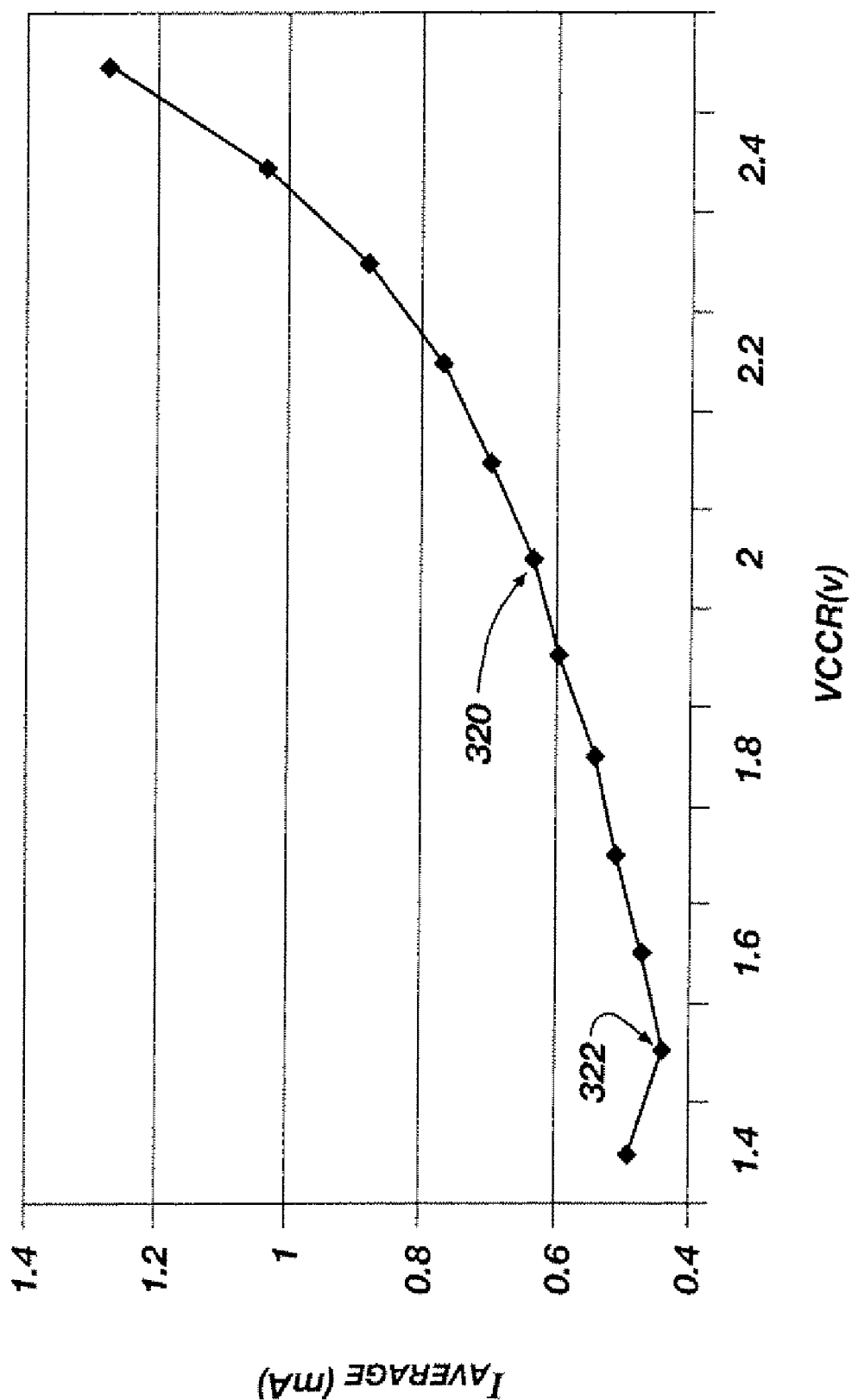
FIG. 6 is a graph illustrating reduced power consumption, in accordance with one or more embodiments of the present invention.

FIG. 6 is a chart illustrating the difference in consumed power of a memory device that utilizes one or more embodiments of the present invention. The chart plots the average device current as a function of the regulated internal operational power VCCR 302 (FIG. 2). While various points are plotted in relationship to the internal operational power VCCR 302, two specific points are highlighted in accordance with the specific example previously presented. The point 320 corresponds with the internal operational power VCCR 302 of approximately 2.0 volts which corresponds to the utilization of approximately 0.63 milliamps as consumed by the memory device. When the power reduction circuit in its one or more embodiments are incorporated within memory device 204 (FIG. 1) and when the memory device 204 is commanded to enter a standby-like operational mode, examples of which are self-refresh and power-down modes, the internal operational power VCCR 302 is decreased to an approximate 1.5 volt level resulting in significant power savings, as illustrated by a point 322 plotted in FIG. 6.

Figure 7:
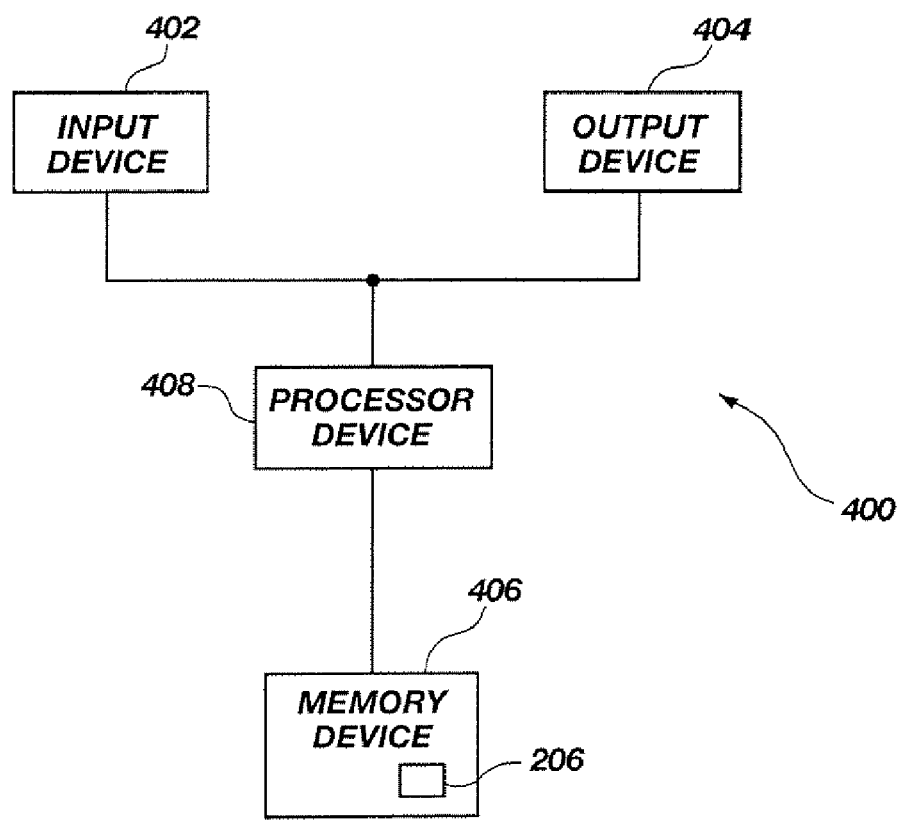
FIG. 7 is a functional block diagram illustrating a computer system including the memory device, in accordance with an embodiment of the present invention.

As shown in FIG. 7, an electronic system 400 includes an input device 402, an output device 404 and a memory device 406 all coupled to a processor device 408. Memory device 406 further includes the power reduction circuit 206 as described herein above.

Figure 8:
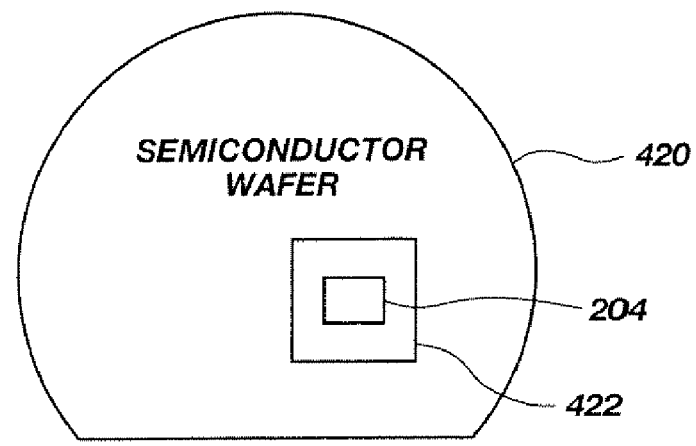
FIG. 8 is a diagram illustrating a semiconductor wafer having a circuit thereon for reducing power consumption in a memory device, in accordance with an embodiment of the present invention.

As shown in FIG. 8, a semiconductor wafer 420 includes a yet-to-be cut integrated circuit die 422 that incorporates the memory device 204 thereon.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention includes all modifications, equivalents, and alternatives falling within the spirit and scope of the invention as defined by the following appended claims.

What is claimed is:

1. A circuit, comprising:
    a fully operational mode reference signal and a standby mode reference signal; and
    a DC-to-DC voltage regulator responsive to a switchably connected one of the fully operational mode reference signal and the standby mode reference signal for generating operational power to a dynamic memory device, the switchably connected one determined at least in part on a refresh state of the dynamic memory device.

2. The circuit of claim 1, further comprising a reference configured as a voltage divider including first and second taps for respectively generating the fully operational mode reference signal and the standby mode reference signal.

3. The circuit of claim 1, further comprising a multiplexer configured to switchably connect the fully operational mode reference signal and the standby mode reference signal to the voltage regulator.

4. The circuit of claim 1, wherein a standby mode is a self-refresh mode of memory cells within a dual data rate memory device.

5. The circuit of claim 1, wherein the standby mode reference signal is switchably connected to the voltage regulator in response to a power-down mode of memory cells within a memory device.

6. The circuit of claim 1, wherein the fully operational mode reference signal corresponds to a regulation of the operational power to approximately 2.0 volts.

7. The circuit of claim 6, wherein the standby mode reference signal corresponds to a regulation of the operational power to approximately 1.5 volts.

8. The circuit of claim 1, wherein the operational power couples to circuitry exclusive of self-refresh circuitry of a memory device.

9. A method for reducing power in a memory device, comprising:
    switchably regulating an operational power in response to one of a hilly operational mode reference signal and a standby mode reference signal; and
    powering circuitry exclusive to self-refresh circuitry on the memory device with the operational power.

10. The method of claim 9, wherein switchably regulating further comprises:
    selecting one of the fully operational mode reference signal and the standby mode reference signal in response to a standby mode of the memory device; and
    regulating the operational power in response to the selected one of the fully operational mode reference signal and the standby mode reference signal.

11. The method of claim 10, wherein the selecting comprises multiplexing the fully operational mode reference signal and the standby mode reference signal in response to the standby mode to an input of a voltage regulator.

12. The method of claim 9, further comprising voltage dividing a common regulator reference to form the fully operational mode reference signal and the standby mode reference signal.

13. The method of claim 9, further comprising separately powering the self-refresh circuitry of the memory device from the operational power.

14. A circuit for reducing power in a dynamic memory device, comprising:
    circuitry exclusive to self-refresh circuitry on the dynamic memory device; and
    a DC-to-DC regulator alternatively down-regulating operational power to at least a portion of the circuitry exclusive to the self-refresh circuitry in response to a standby mode.

* * * * *

UNITED STATES PATENT AND TRADEMARK OFFICE
CERTIFICATE OF CORRECTION

PATENT NO. : 7,460,429 B2
APPLICATION NO. : 11/778366
DATED : December 2, 2008
INVENTOR(S) : Schoenfeld It is certified that error appears in the above-identified patent and that said Letters Patent is hereby corrected as shown below:

On the Title page, in field (57), under "Abstract", in column 2, line 10, after "outputs" insert -- for --.

In column 12, line 26, in Claim 9, delete "hilly" and insert -- fully --, therefor.

Signed and Sealed this

Third Day of February, 2009

JOHN DOLL
*Acting Director of the United States Patent and Trademark Office*